United States Patent [19]
Armini et al.

[11] 4,353,160
[45] Oct. 12, 1982

[54] SOLAR CELL JUNCTION PROCESSING SYSTEM

[75] Inventors: Anthony J. Armini; Roger G. Little, both of Bedford, Mass.

[73] Assignee: Spire Corporation, Bedford, Mass.

[21] Appl. No.: 209,542

[22] Filed: Nov. 24, 1980

[51] Int. Cl.$^3$ ............................................. H01L 31/18
[52] U.S. Cl. ...................................... 29/572; 136/243; 148/1.5; 250/492.2; 250/492.3
[58] Field of Search ............................ 29/572; 148/1.5; 136/258, 261, 290, 243; 250/492 A, 492 B

[56] References Cited

U.S. PATENT DOCUMENTS 4,313,254  2/1982  Feldman et al. ....................... 29/572

OTHER PUBLICATIONS

A. R. Kirkpatrick, "Low Energy Production Processes in Manufacturing of Silicon Solar Cells" *Sharing the Sun—vol. 6, Photovoltaics & Materials,* Solar Energy Society of Canada (1976), pp. 67-72.
A. R. Kirkpatrick et al., "Silicon Solar Cells by Ion Implantation and Pulsed Energy Processing", *Conf. Record, 12th IEEE Photovoltaic Specialists Conf.* (1976), pp. 299-302.
A. R. Kirkpatrick et al., "Production Technology for High Efficiency Ion Implanted Solar Cells", *Conf. Record, 13th IEEE Photovoltaic Specialists Conf.* (1978), pp. 706-710.
R. O. Bell et al., "Ion Implanted Solar Cells from EFG Silicon Ribbons", *Proceedings, 2nd European Photovoltaic Solar Energy Conf.* (1979), pp. 153-161.
J. C. Muller et al., "Low Cost Ion Implantation Procedure for the Realization of Silicon Solar Cells in A Continuous Way", *Conf. Record, 13th IEEE Photovoltaic Specialists Conf.* (1978), pp. 711-716.

*Primary Examiner*—Aaron Weisstuch
*Attorney, Agent, or Firm*—Morse, Altman, Oates & Dacey

[57] ABSTRACT

An integrated system and process for the continuous formation of p-n junctions in solar cells in a cost-effective manner and under computer control. The integrated system essentially comprises an ion beam implanter, an electron beam annealer and a combination vacuum lock-and-wafer transport system, all disposed within a unitary housing maintained under a common vacuum environment.

The integrated system employs no wet chemistry operations and, is characterized by high reproducibility and narrow solar cell performance distribution.

16 Claims, 5 Drawing Figures

SOLAR CELL JUNCTION PROCESSING SYSTEM

BACKGROUND OF THE INVENTION

1. Field of the Invention

The present invention relates generally to solar cells and, more particularly, to an integrated system and process for the continuous formation of p-n junctions in solar cells in a cost-effective manner and under computer control.

2. The Prior Art

The formation of p-n barrier junctions in the manufacture of solar cells traditionally has represented an expensive and time-consuming process step. Several reasons have existed for this. Solar cells must be produced both with high cell efficiencies and with narrow performance distributions. P-n junctions produced according to the diffusion process more or less have met the above requirements but at the expense of other considerations. The diffusion process requires wet chemistry operations which, in turn, require large-scale waste processing plants. In addition, the diffusion process requires detailed and continuous attention to critical process parameters by skilled operators. Further, the diffusion process is dependent on the quality and uniformity of supplies produced by others. Other known processes have been even less efficient and/or desirable. Semiconductor wafers are also sensitive to handling, particularly wafer scratching frequently occurring when the wafers are transported. Forming p-n junctions in solar cells, therefore, involves difficult complexities.

SUMMARY OF THE INVENTION

It is a principal object of the present invention to overcome the above disadvantages by providing an integrated system and process for the continuous formation of p-n junctions in solar cells in a cost-effective manner and under computer control.

More specifically, it is an object of the present invention to provide an integrated junction processing system and process for solar cells comprising a housing maintained under a vacuum environment and incorporating a p-n junction member and a combination vacuum lock-and-wafer transport system, all under the operative control of a computer. The integrated junction processing system and process eliminates all wet chemistry operations and, is characterized by a high degree of reproducibility, narrow solar cell performance distribution and maximum cell efficiencies, and is operable in a continuous mode with no special operator skill being required. Preferably, the computer is a microprocessor and the p-n junction forming member includes an ion beam implanter and an electron beam annealer. Preferably, the vacuum environment is achieved using cryogenic pumps, eliminating the requirement for liquid nitrogen. The housing is provided with process controls for the ion beam implanter and electron beam annealer, including an ion beam current integrator for implant dose control. The same combination vacuum lock-and-wafer transport system services bot the implanter and the annealer. In an alternative embodiment the p-n junction forming member preferably comprises at least two parallel throughput lines wherein each of the throughput lines preferably includes its separate ion beam implanter, its separate electron beam annealer and its separate combination vacuum lock-and-wafer transport system. Preferably, a number of wafers are contained in cassettes when introduced into the housing, with the processed solar cells reloaded into cassettes before exiting from the housing.

Other objects of the present invention will in part be obvious and will in part appear hereinafter.

The invention accordingly comprises the integrated system and process of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF PREFERRED EMBODIMENTS

In general, the present invention provides an integrated system and process for the continuous formation of pn-n junctions in solar cells in a cost-effective manner and under computer control. The integrated system essentially comprises a unitary housing maintained under vacuum, a p-n junction forming member including an ion beam implanter and an electron beam annealer, and a combination vacuum lock-and-wafer transport system. The housing features implanter and annealer controls, and wafer input and wafer output locks. The computer is preferably a dedicated microprocessor.

The integrated system of the invention employs no wet chemistry operations, is characterized by high reproducibility, a narrow cell performance distribution and noncritical routine processing, with only minimum operator skill being required.

THE SYSTEMS OF FIGS. 1, 2 AND 3

Figure 1:
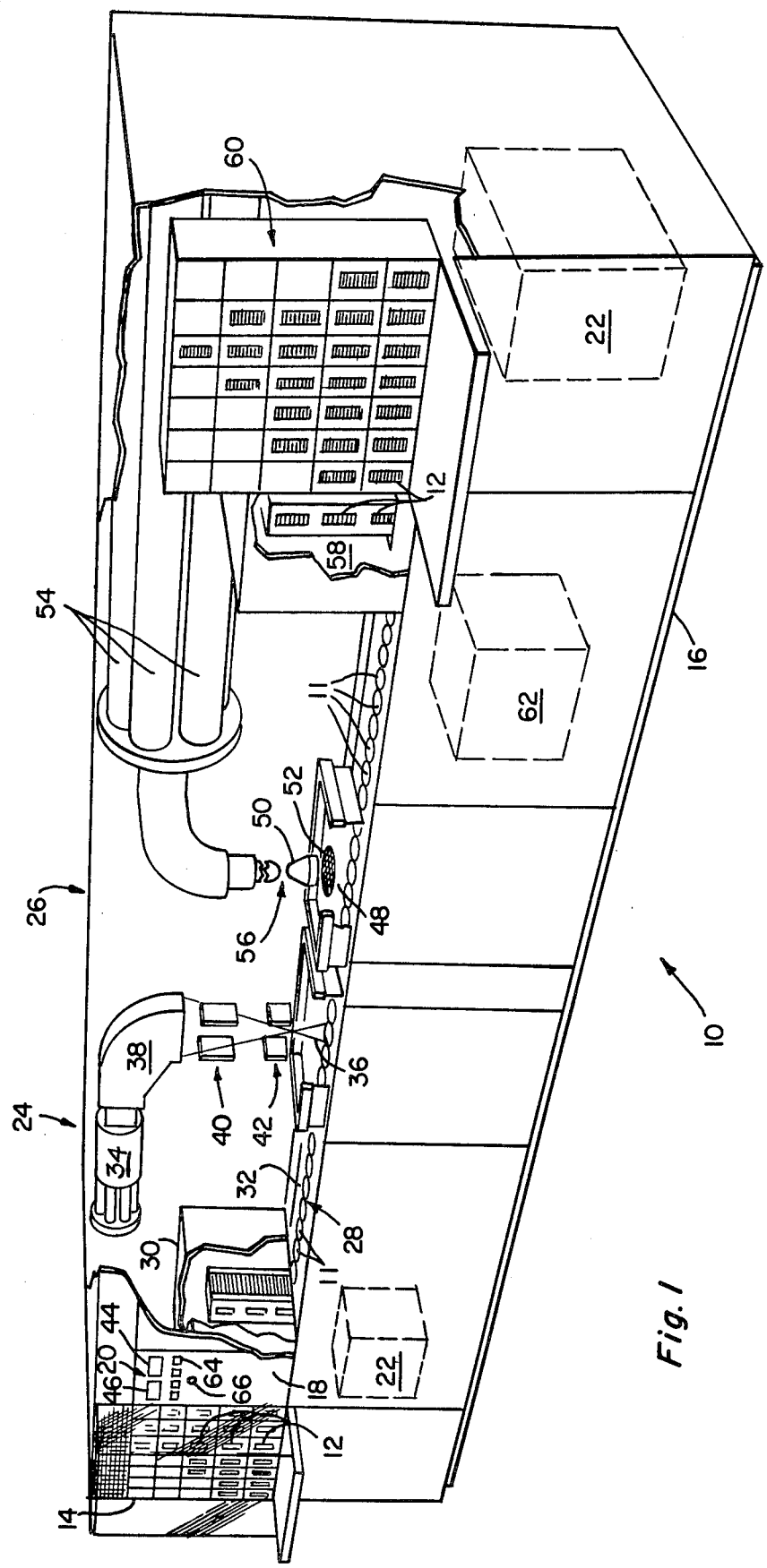
FIG. 1 is a perspective view of an integrated junction processing system for solar cells constructed in accordance with the invention, with parts broken away to expose the interior of the system.

In FIG. 1, there is shown in perspective an integrated junction processing system 10 for solar cells constructed in accordance with the invention. A "solar cell" is a p-n junction device which converts the radiant energy of sunlight directly and efficiently into electrical energy. A solar cell essentially comprises front and rear semiconductor strata, formed of different p and n character and separated by a p-n barrier, for generating a photovoltaic effect in response to incident solar radiation, and front and rear ohmic electrical contacts. Most solar cells nowadays are made from monocrystalline semiconductor materials, such as for example single-crystal silicon wafers. The semiconductor wafers are also preferably made either p-type or n-type by incorporating in the semiconductor material the respective type of dopant impurity during their manufacture. The semiconductor wafers may be made according to any known method, including the heat exchanger method (HEM), any of the direct sheet growth techniques such as EFG, WEB and RTR, casting in a SILSO-like process, melt replenishment Cz growth in a polycrystalline mode followed by crystal slab cutting, etc. The slabs are then sliced, preferably using a fixed abrasive sawing technique (FAST) to produce thin, square, semiconductor wafers of a preferred size of about 11 cm × 11 cm and nine mils thick. The junction side of the wafers is then preferably plasma etched to remove the saw damage occurring during slicing. Plasma etching is preferably effected in a barrel-type reactor where the junction sides of the wafers are exposed to the plasma, typically sulfur hexafluoride gas ($SF_6$). A number of the plasma etched semiconductor wafers 11, either p-type or n-type, are then loaded into cassettes 12. The cassettes 12 in turn are manually introduced into an input cassette bin 14 provided at one end of the integrated junction processing system 10.

System 10 preferably is built with a unitary housing 16. Housing 16 incorporates all of the operative parts of the system 10 and features, preferably on a front panel 18, a series of process controls 20. Preferably in the bottom part of the housing 16 and near its respective ends, so as to be readily accessible from at least three sides, are provided a number of cryogenic pumps 22. These cryogenic pumps 22 are designed to maintain the inside of the housing 16 at the required vacuum, eliminating thereby any requirement for using liquid nitrogen for this purpose.

The three main operative parts of the junction processing system 10 disposed within the housing 16 include an ion beam implanter 24, an electron beam annealer 26 and a combination vacuum lock-and-wafer transport system 28. The operation of this combination vacuum lock-and-wafer transport system 28 will be more fully described with reference to FIG. 5. The functions of the combination vacuum lock-and-wafer transport system 28 include the automatic introduction of the cassettes 12, one by one, from the input cassette bin 14 into the input vacuum lock 30. Within the input vacuum lock 30, the system 28 is designed to remove seriatim the semiconductor wafers 11 from the cassettes 12 and to feed these wafers 11 onto a wafer mover 32 comprising a part of the combined system 28. Since the semiconductor wafers 11 are delicate and rather sensitive to handling, the wafer mover 32 is designed for very gentle wafer handling so as to avoid damage to the wafers, such as by scratching. Preferably, the wafer mover 32 is of the "walking beam" design in which there is no relative motion of the wafer 11 with respect to the beam of the wafer mover 32. Such a walking-beam design wafer mover uses no oils or greases and has no rubbing parts in the internal vacuum environment in which it is designed to operate within the housing 16. Other designs for the wafer mover 32 can be also acceptable provided they can move the wafers 11 continuously in an indexing fashion and with a high degree of reliability, first into operative position with respect to the ion beam implanter 24 and then into operative position with respect to the electron beam annealer 26.

Since preferably the junction side surface of the semiconductor wafers 11 is not texturized, rotation of the wafers 11 is not required when the wafers 11 arrive in operative position with respect to the ion beam implanter 24. In instances where semiconductor wafers with texturized junction side surfaces are to be processed through the junction processing system 10, the wafer mover 32 must be so designed that, in addition to moving such wafers into operative position with respect to the ion beam implanter 24, it also imparts rotational movement to the wafers thereat.

Implant processing for junction dopant introduction has many advantages, including absence of wet chemistry operations and of diffusion masks. Because ion implantation is a line-of-sight process, no saw or laser cutting is required for junction isolation. Ion implantation, furthermore, does not alter the surface morphology or optical absorptivity of the semiconductor wafers 11. Consequently, ion implantation of the wafers 11 does not subject the wafers 11 to the physical problems characteristic of other preparation methods. Quite the contrary, the ion implanted surfaces of the wafers 11 exhibit the same physical and optical qualities possessed by the wafers 11 prior to ion implantation.

The ion beam implanter 24 includes an ion source 34 for generating an ion beam 36, a mass analyzing magnet 38 for bending the ion beam 36 and for preventing contaminant material in the dopant gas supplies from becoming accelerated and also implanted, an electrostatic lens 40 for focusing the ion beam 36, and a magnetic scanner 42 for directing the ion beam 36 at the semiconductor wafers 11 as they are continuously indexed into position relative the ion beam 36. Dwell time of the wafers 11 under the influence of the ion beam 36 depends upon the selected implant parameters inputted at the process controls 20 located on the front panel 18 of the housing 16. The process controls 20 include, among others, a display 44 for an ion beam digital current integrator and a display 46 for a voltage sensor, for controlling a predetermined level of implant dose and junction depth.

The semiconductor wafers 11 have already been doped by one type of dopant material during their manufacture so as to render them either p-type or n-type. Consequently, only a single ion species need be implanted by the implanter 24 in order to form p-n junctions in the wafers 11. The preferred ion species include boron for n-type wafers and phosphorous for p-type wafers. Ion beam implanter 24 uses about 0.016 $cm^3$ dopant gas per minute, consumes about 1.6 KW hr. per minute, requires about 0.8 cubic foot per minute coolant water and generates about 100 cubic feet of waste gas per minute. The waste gas is removed by gas scrubbing technique at the rear of the housing 16. Plumbing and electrical power connections are also provided at the rear of the housing 16. It should be noted, however, that there are no wet chemistry operations involved with the ion beam implanter 24. Preferred implant parameters range from a low of about $1.5 \times 10^{15}$ dopant ions/$cm^2$ at 10 KeV to a high of about $5.0 \times 10^{15}$ dopant ions/$cm^2$ at 50 KeV.

Following ion implantations for junction dopant introduction, the inherent lattice damage in the wafers 11 caused by ion implantation at relatively high doses and low energy must be annealed. To this end, the wafers 11 are moved by the wafer mover 32 in registry with an electron beam 48. The electron beam 48 emanates from a cathode electron-beam emitter 50 and across an anode grid 52 of the electron beam annealer 26. Annealer 26 includes a plurality of transmission line high voltage capacitors 54 shown disposed circumferentially about a central horizontal axis. Capacitors 54 serve as transmission lines during discharge across a trigger gap switch 56. The electron beam 48 is preferably pulsed. Characteristics of the electron beam 48 preferably include an average electron energy of about 10 KeV and a beam energy density of about 0.1 cal/cm$^2$. The pulsed electron beam 48 directed at a wafer 11 positioned under the anode grid 52 momentarily elevates the temperature of the junction side surface of the wafer 11 above a temperature threshold level so that annealing in the heated region is effected. As a result of this pulse annealing, both grain boundary diffusion and surface oxide growth on the annealed wafers 11 are effectively precluded. This facilitates further processing of the wafers 11 by eliminating the need for a further etching operation to remove the oxides. Of course, the electron beam annealer 26 shares the common vacuum environment with the ion beam implanter 24, eliminating thereby an otherwise costly material handling step between ion implantation and annealing.

Following annealing, the processed wafers 11 are carried by the wafer mover 32 into a second vacuum lock 58 where they are automatically reloaded once again into cassettes 12. The loaded cassettes 12 are then automatically transferred from the vacuum lock 58 into an output cassette bin 60. The processed wafers 11 contained in the cassettes 12 and temporarily stored in the bin 60 remain in the bin 60 until the cassettes 12 are manually removed therefrom as called for in the further processing of the wafers 11 on their way to be fabricated into solar panels.

The entire operation of the integrated junction processing system 10 above described is under computer control represented by a built-in dedicated microprocessor 62. All that an operator is required to do is first to make sure that all systems are on and in operative readiness and, second that there are a sufficient number of cassettes 12 in the input cassette bin 14. Then, after checking and adjusting both implant and annealing parameters at the process controls 20 on the front panel 18, the operator need only press the start button 64 to commence the automatic operation of the system 10.

Considerable safeguards are incorporated in the system 10 to trigger the microprocessor 62 automatically to shut off further operations in cases of malfunction anywhere in the system 10 or if processing parameters are exceeded. When a shut-off in the system 10 occurs, a warning light 66 is lit up on the front panel 18 and, in addition, a pulsing audible warning sound is heard to alert the operator that human intervention is required. If for some reason no operator is in attendance so that the above warnings remain unheeded for a predetermined time (about five minutes), then the microprocessor 62 will shut off all power to the system 10 and close all valves.

Figure 2:
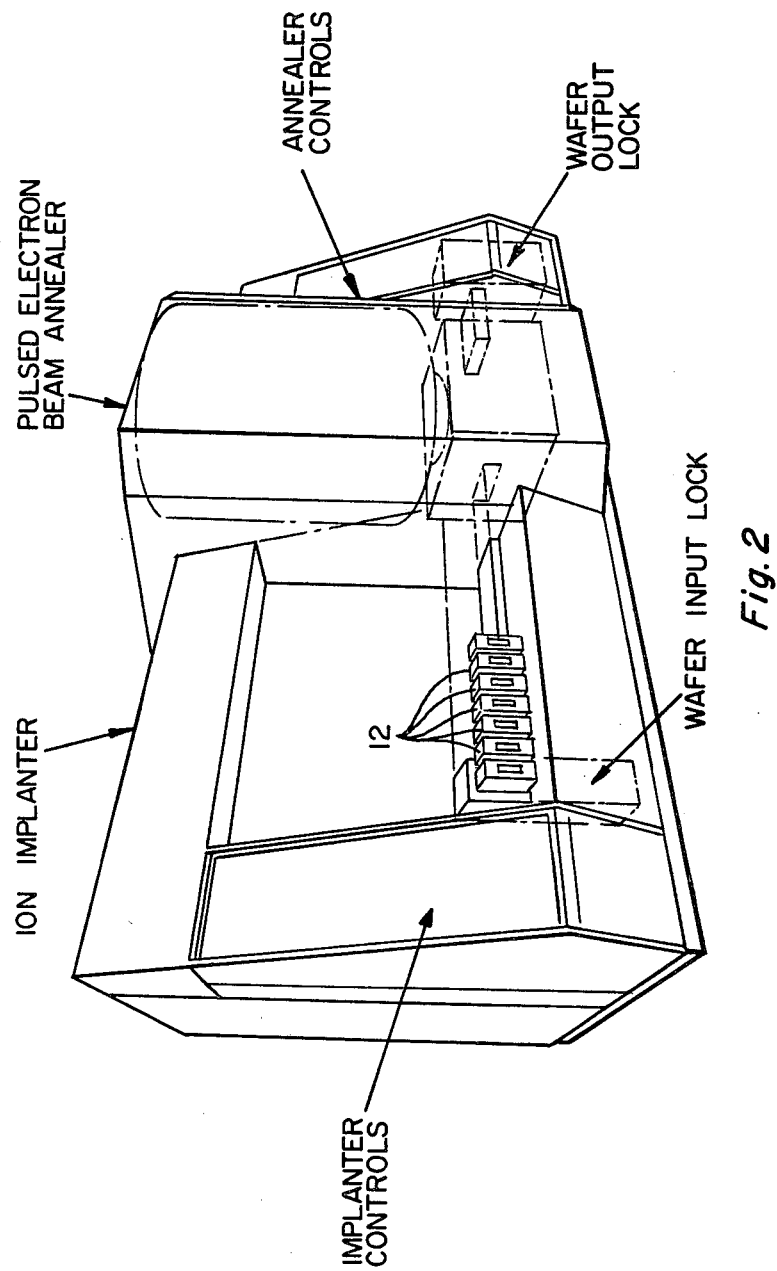
FIG. 2 is a perspective view of another integrated junction processing system for solar cells constructed in accordance with the invention.
Figure 3:
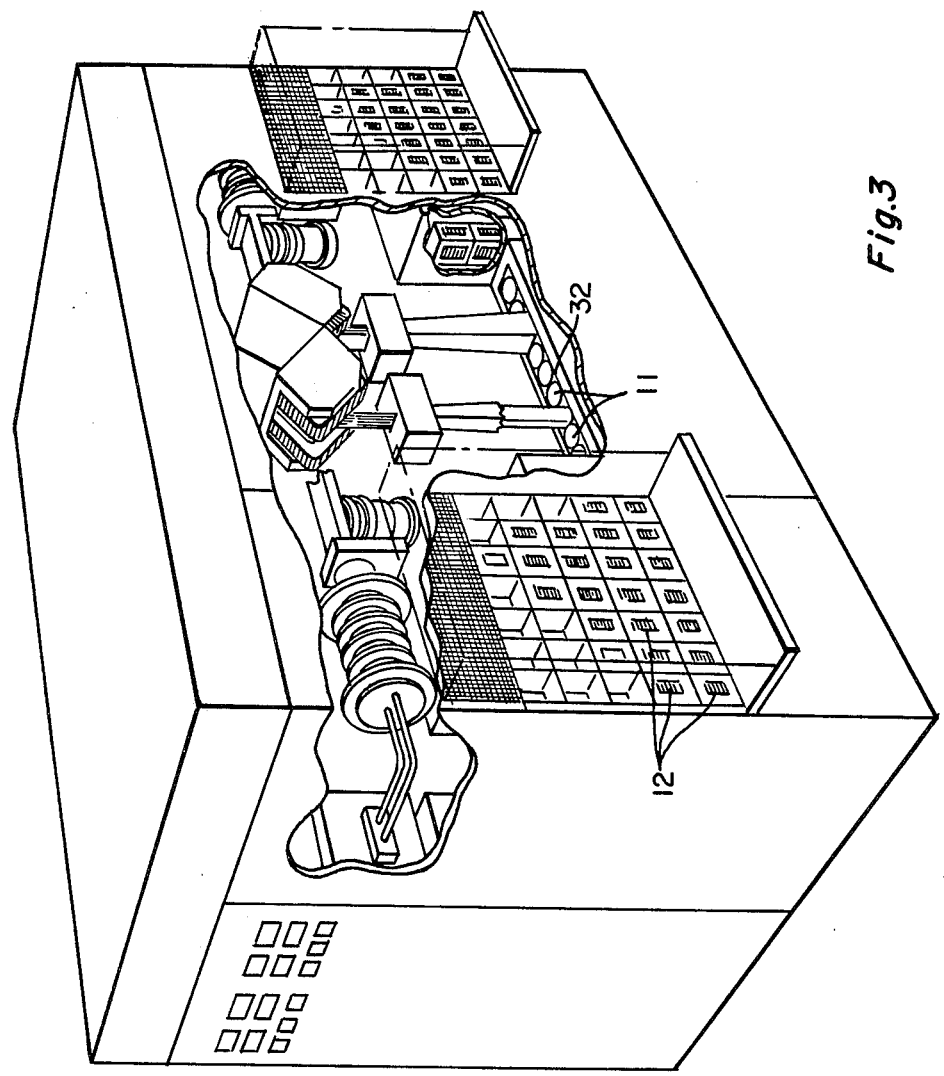
FIG. 3 is a perspective view of yet another integrated junction processing system for solar cells constructed in accordance with the invention, with parts broken away to expose the interior of the system.

The junction processing systems illustrated in FIGS. 2 and 3 are functionally identical to the system 10 above described with reference to FIG. 1. The systems of FIGS. 2 and 3, furthermore, each comprise an ion beam implanter, an electron beam annealer, a combination vacuum lock-and-wafer transport system, all under the operational control of a microprocessor and arranged within a unitary housing. Each of the systems of FIGS. 2 and 3 is designed to accept and process semiconductor wafers 11 disposed within identical cassettes 12 in much the same way as the system 10 above described with reference to FIG. 1. Aside from outward appearance, size, shape, and some design differences, the systems of FIGS. 2 and 3 essentially differ from the system 10 of FIG. 1 as well as from each other in production capacity. The systems of FIGS. 1 and 2 are designed to process about 1,800 wafers 11 per hour. The system of FIG. 3, which performs the ion implant step only, is designed to process about 2,400 wafers 11 per hour.

THE SYSTEM OF FIG. 4

Figure 4:
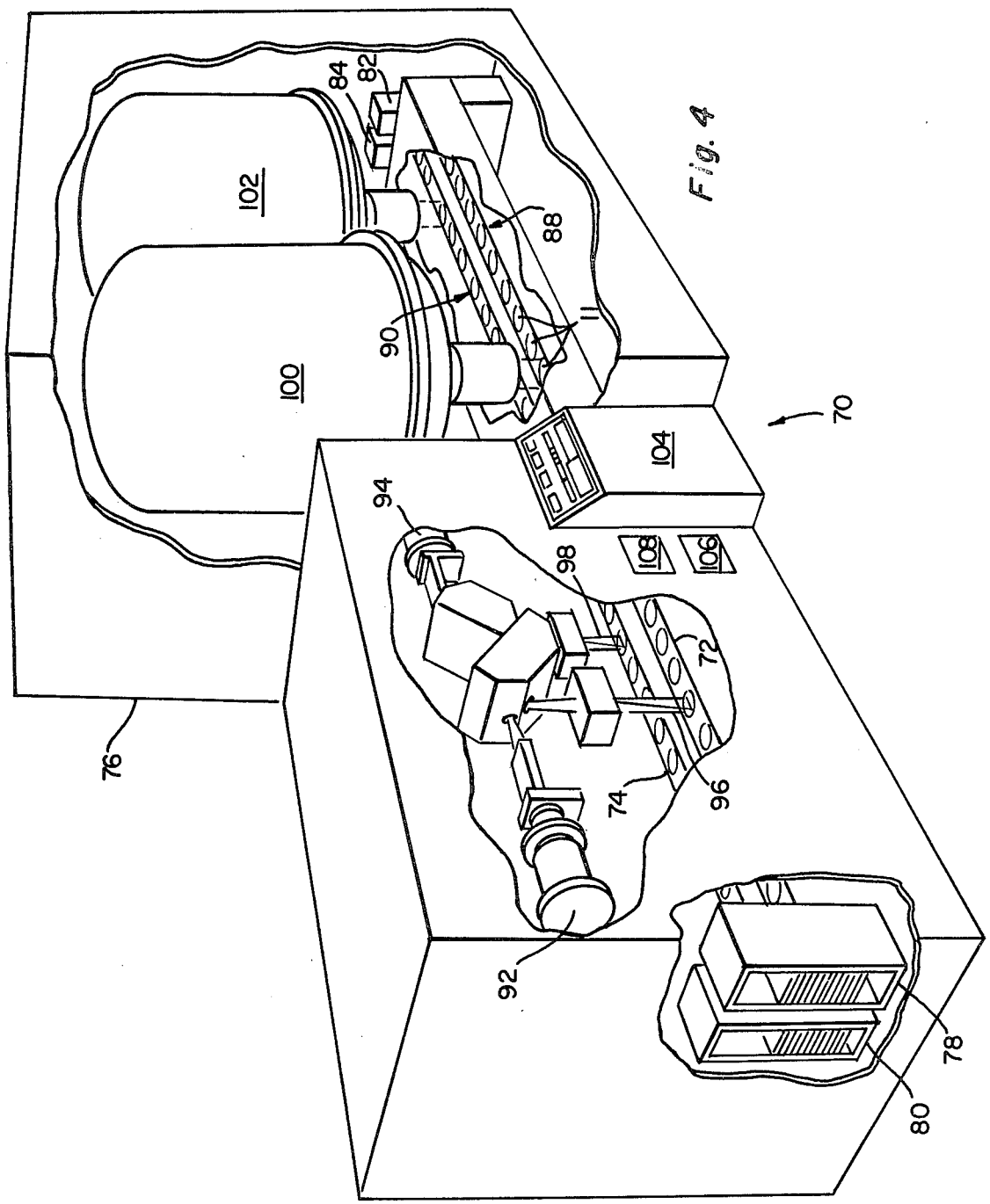
FIG. 4 is a perspective view of still another integrated junction processing system for solar cells constructed in accordance with the invention, with parts broken away to expose the interior of the system which features two parallel throughput lines.

In FIG. 4, there is shown in perspective an integrated junction processing system 60 that is characterized by having two parallel throughput lines 72 and 74. Each throughput line 72 and 74 is designed to handle 3,600 wafers 11 per hour, doubling thus the output of the system 10 of FIG. 1. This output doubling is achieved at very moderate extra expense and with only a modest increase in floor space requirement. Furthermore, both throughput lines 72 and 74 are disposed within one unitary housing 76 whose interior is maintained under a common vacuum environment shared by both lines 72 and 74. In addition to doubling the output at modest incremental expense, system 70 can be kept in production even if one throughput line breaks down. Furthermore, both operational and maintenance expenses for operating both throughput lines 72 and 74 are less in the one system 70 than operating two separate junction processing systems 10 of the kind shown in FIG. 1.

Each throughput line 72 and 74 preferably includes its own input 78, 80 and output 82, 82 vacuum locks and wafer transport systems 88 and 90, respectively. Further, each line 72 and 74 also preferably has its own ion source 92, 94, each generating its own ion beam 96 and 98, respectively. Preferably, each line 72 and 74 also includes its separate electron beam annealer 100 and 102, respectively. Both lines 72 and 74 are each operated from one operation control console 104, however. Control console 104 is preferably centrally placed of the system 70 for convenience of the operator. Preferably, a separate microprocessor 106 and 108 controls the operation of each throughput line 72 and 74.

Figure 5:
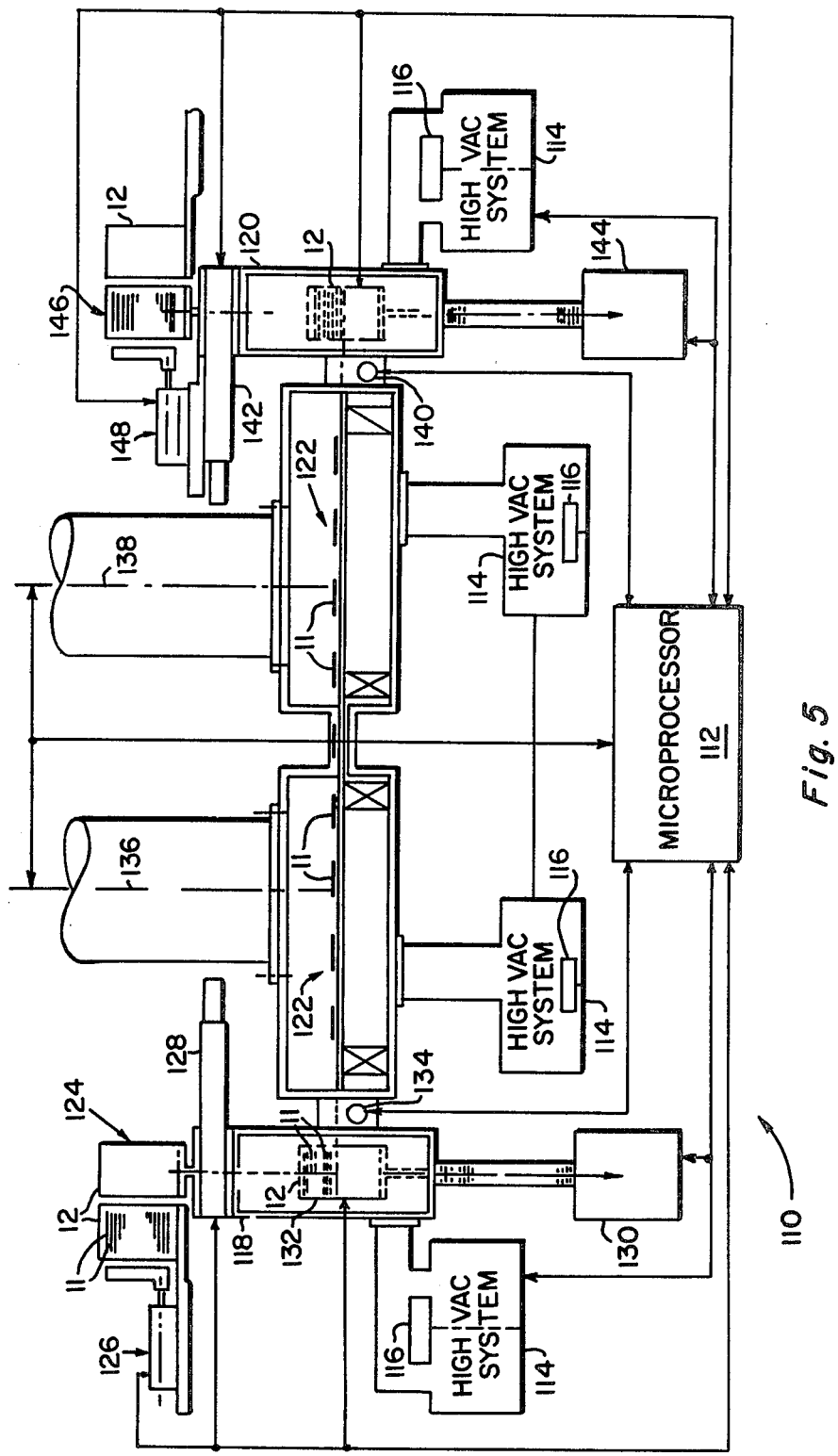
FIG. 5 is a schematic elevational view of a preferred combination vacuum lock-and-wafer transport system useful in either of the integrated systems shown in FIGS. 1–4.

The Wafer Transport System of FIG. 5

In FIG. 5 is depicted a schematic elevational view of a preferred embodiment of a combination vacuum lock-and-wafer transport system 110 under the operational control of a dedicated built-in microprocessor 112. This combination vacuum lock-and-wafer transport system 110 is useful in any of the junction processing systems shown in and described with reference to FIGS. 1–4.

As its name indicates, combination vacuum lock-and-wafer transport system 110 essentially comprises a high vacuum system 114 using a plurality of cryogenic pumps 116 and having an input lock 118 and an output lock 120, and a wafer transport system 122. Cassettes 12 containing the wafers 11 to be processed are moved into a load position 124 by a transfer mechanism 126. When a gate valve 128 is opened, an elevator drive 130 is designed to introduce the cassette 12 from the load position 124 to a field position 132 within the input lock 118. In the feed position 132, the wafers 11 are removed automatically and one by one from the cassette 12 and transferred via a valve 134 onto the wafer transport system 122. Wafer transport system 122 is designed to move the wafers 11 to be processed gently and without scratching them into position, first with respect to an ion beam 136 to effect ion implantation, and second with respect to and electron beam 138 to effect annealing thereof. The processed wafers 11 are then admitted into the output lock 120 via a second valve 140, where they are automatically reloaded into a cassette 12. When the cassette 12 is filled with processed wafers 11, a gate valve 142 associated with output lock 120 is opened and an elevator drive 144 transfers the filled cassette 12 to an unload position 146 of a second transfer mechanism 148. All of the above operations are effectively coordinated by the microprocessor 112.

CONCLUSION

Thus it has been shown and described an integrated system and process for the continuous formation of p-n junctions in solar cells in a cost-effective manner and under computer control.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. An integrated dry junction processing system for solar cells comprising:
   (a) a unitary housing provided with a solar cell input lock and a solar cell output lock;
   (b) means for maintaining said housing under vacuum said means including a number of cryogenic pumps;
   (c) continuous means including a combination vacuum lock-solar cell transport system and an ion beam implanter and a pulsed electron beam annealer for forming p-n junctions in solar cells within said housing, said pulsed electron beam annealer including a plurality of transmission line capacitors disposed circumferentially about a central horizontal axis;
   (d) said housing featuring process controls for said ion beam implanter and said pulsed electron beam annealer and including an ion beam current integrator for implant dose control.

2. The integrated junction processing system of claim 1 wherein said continuous means includes computer control means.

3. The integrated junction processing system of claim 2 wherein said computer control means is a built-in microprocessor.

4. The integrated junction processing system of claim 1 wherein said ion beam current integrator is a digital current integrator.

5. The integrated junction processing system of claim 1 including cassette means for loading a plurality of said solar cells into said housing via said input lock and means for reloading the processed solar cells into cassettes in said output lock.

6. The integrated junction processing system of claim 1 wherein said ion beam implanter includes an ion source and a magnetic scanner to focus the ion beam of said implanter seriatim at said solar cells.

7. The integrated junction processing system of claim 1 further characterized in that said continuous means includes at least two parallel throughput lines, with each of said lines designed for forming p-n junctions in solar cells within said housing.

8. The integrated junction processing system of claim 7 wherein each of said throughput lines includes its separate ion beam implanter, its separate pulsed electron beam annealer, and its separate combination vacuum lock-solar cell transport system.

9. The integrated junction processing system of claim 7 further characterized in that said continuous means includes a built-in microprocessor.

10. A junction processing system for solar cells comprising:
    (a) a housing;
    (b) means for maintaining said housing under vacuum, said means including a number of cryogenic pumps;
    (c) means for forming p-n junctions in solar cells within said housing, including an ion beam implanter and a pulsed electron beam annealer;
    (d) said ion beam implanter including an ion source and a magnetic scanner to focus the ion beam of said implanter seriatim at said solar cells;
    (e) said pulsed electron beam annealer including a plurality of transmission line capacitors disposed circumferentially about a central horizontal axis;
    (f) means for transporting solar cells past said means for forming p-n junctions therein, said transporting means including a combination vacuum lock-solar cell transport system;
    (g) computer means for operating said junction processing system;
    (h) said housing provided with a solar cell input lock and a solar cell output lock forming a part of said transport system, with a plurality of said solar cells contained in cassette when introduced into said housing via said input lock, and being further characterized in that the processed solar cells are reloaded into cassettes in said output lock;
    (i) said housing featuring process controls for said implanter and said annealer, said process controls including an ion beam current integrator for implant dose control.

11. The junction processing system of claim 10 wherein said computer means is a microprocessor.

12. The junction processing system of claim 10 further characterized in that said means for forming p-n junctions in solar cells is a continuous means and includes at least two parallel throughput lines.

13. The junction processing system of claim 12 wherein each of said throughput lines includes its separate ion beam implanter, its separate pulsed electron beam annealer, and its separate combination vacuum lock-solar cell transport system.

14. The junction processing system of claim 13 wherein two of said separate ion beam implanters have a common ion source.

15. The junction processing system of claim 10 wherein said ion beam current integrator is a digital current integrator.

16. A continuous, microprocessor-controlled process for the formation of p-n junctions in solar cells comprising:
    (a) providing a plurality of semiconductor wafers integrally formed with one dopant material;
    (b) loading a number of said wafers into cassettes;
    (c) introducing said wafers with said cassettes via vacuum locks into a vacuum environment;
    (d) removing said wafers from said cassettes and ion implanting said wafers within said vacuum environment with a second dopant material;
    (e) annealing said ion implanted wafers by pulsing said wafers with an electron beam of an annealer including a plurality of transmission line capacitors;
    (f) reloading said annealed wafers into cassettes; and
    (g) removing said wafers with said cassettes via vacuum locks from said vacuum environment.

* * * * *